(12) United States Patent
Jitsuno et al.

(10) Patent No.: US 8,744,798 B2
(45) Date of Patent: Jun. 3, 2014

(54) SIGNAL GENERATOR AND USER INTERFACE FOR ADDING AMPLITUDE NOISE TO SELECTED PORTIONS OF A TEST SIGNAL

(75) Inventors: Kunihisa Jitsuno, Tokyo (JP); Susan C. Adam, Portland, OR (US); Muralidharan Karapattu, Karnataka (IN); Joan Mercadé, Barcelona (ES)

(73) Assignee: Tektronix International Sales GmbH, Rheinfall (CH)

( * ) Notice: Subject to any disclaimer, the term of this patent is extended or adjusted under 35 U.S.C. 154(b) by 1179 days.

(21) Appl. No.: 12/136,852

(22) Filed: Jun. 11, 2008

(65) Prior Publication Data
US 2008/0310490 A1 Dec. 18, 2008

(30) Foreign Application Priority Data
Jun. 12, 2007 (IN) .......................... 1112/MUM/2007

(51) Int. Cl.
*G06F 19/00* (2011.01)

(52) U.S. Cl.
USPC ........................................................ 702/124

(58) Field of Classification Search
USPC ....................................................... 702/124
See application file for complete search history.

(56) References Cited

U.S. PATENT DOCUMENTS 7,596,495 B2 * 9/2009 Kazama et al. ................ 704/226
2007/0185947 A1 * 8/2007 Yoshitake et al. ............. 708/271

FOREIGN PATENT DOCUMENTS

| JP | 2004-56361 | 2/2004 |
| JP | 2004-510372 | 4/2004 |
| JP | 2005-260939 | 9/2005 |

* cited by examiner

*Primary Examiner* — Aditya Bhat
(74) *Attorney, Agent, or Firm* — William K. Bucher; Marger Johnson & McCollom PC (57) ABSTRACT

A signal generator generates amplitude noise on a selected segment of a test signal. A user interface is used for selecting a segment of the test signal and an associated power level for applying amplitude noise at a selected power level to the test signal segment. A signal processing unit compiles the selected power level of the selected segment with the test signal to generate digital data representative of the test signal with selected segments having amplitude noise. A waveform generator receives the digital data and generating a test signal output having amplitude noise at selected segments of the test signal. The method includes the steps of: selecting a segment of the test signal to add amplitude noise; selecting a power level for the amplitude noise; and applying the amplitude noise at the selected power level to the selected segment of the test signal.

12 Claims, 12 Drawing Sheets

| Modulation | |
|---|---|
| Modulation | |
| Modulation Type | 2 FSK ▼ |
| FSK Index | 0.5000 |
| Coding | None ▼ |
| Symbol Rate | 1.152000  MHz ▼ |
| Sequence Length | 11520  sym |

Filter / Window

| | |
|---|---|
| Filter Function | Gauss ▼ |
| B * T | 0.50 |
| Window Function | Rect ▼ |
| Chebyshev Ripple /dB | 0.00 |
| Impulse Length | 32 |
| Oversampling ☐ Auto | 16 |
| Bb. Impulse ☑ Auto | Rect ▼ |

[ OK ]  [ Cancel ]  [ Advanced ]

SIGNAL GENERATOR AND USER INTERFACE FOR ADDING AMPLITUDE NOISE TO SELECTED PORTIONS OF A TEST SIGNAL

CROSS-REFERENCE TO RELATED APPLICATIONS

This patent application clams priority from Indian Provisional patent application Serial No. 1112/MUM/2007, filed Jun. 12, 2007 and incorporates by reference herein the contents of Indian Provisional patent application No. 1112/MUM/2007 as if such contents were set forth in full herein.

BACKGROUND OF THE INVENTION

The present invention relates generally to the generation of test signal and more particularly to a signal generator and user interface for adding noise to selected portions of the test signal generated by the signal generator.

To check the operation of an electrical circuit under test, a test signal is provided to the circuit under test. A signal generator is an apparatus that provides such at test signal for checking the operation of the circuit under test. The signal generator has controls for setting-up the test signal according to user settings. The output signal from the electrical circuit may be observed by a measurement instrument, such as an oscilloscope or the like.

Figure 1A:
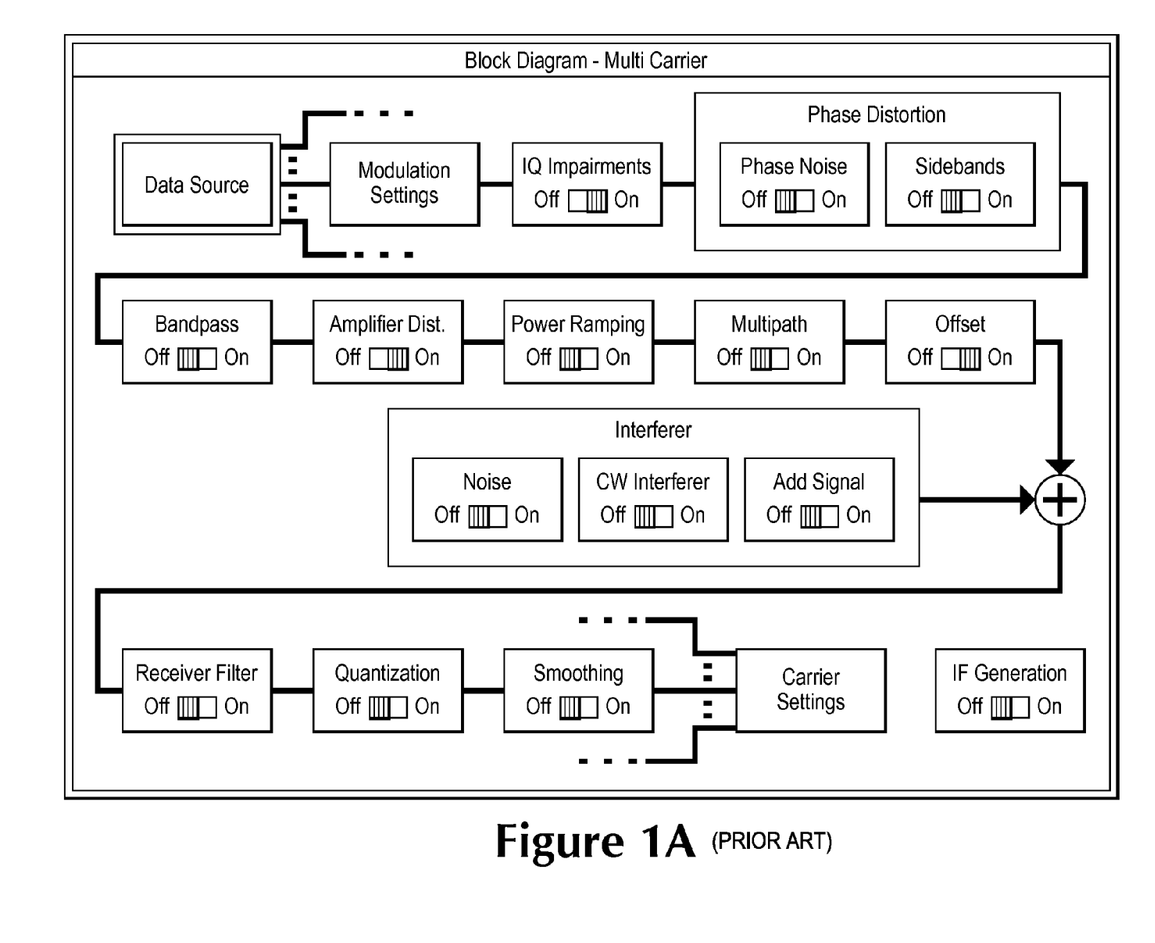
FIG. 1A is a Multi-carrier block diagram of an existing simulation software program for setting-up digitally modulated signals and adding impairments to the signals.
Figure 1B:
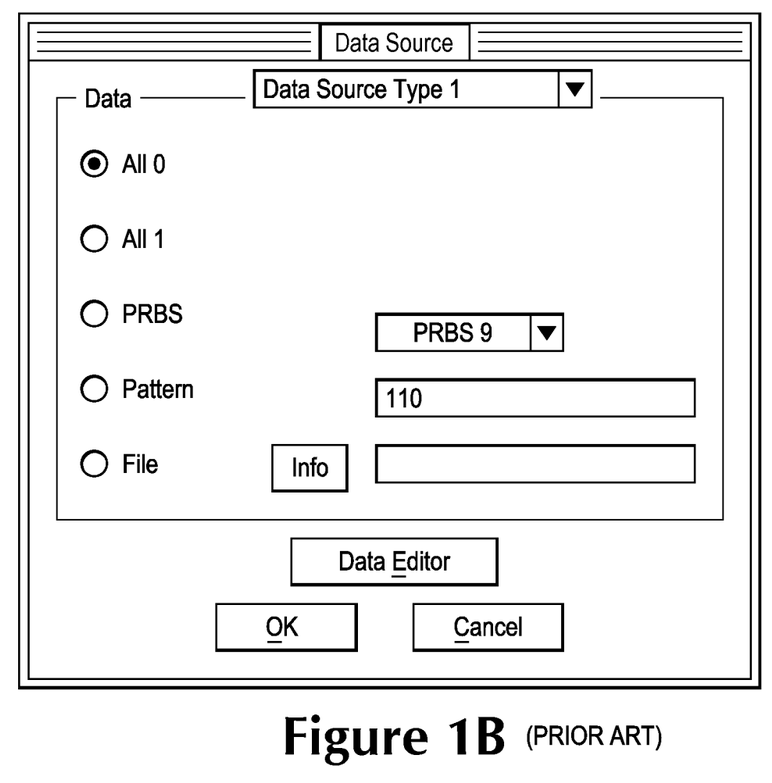
FIG. 1B is a data source dialog window called using the Multi carrier block diagram.
Figure 2A:
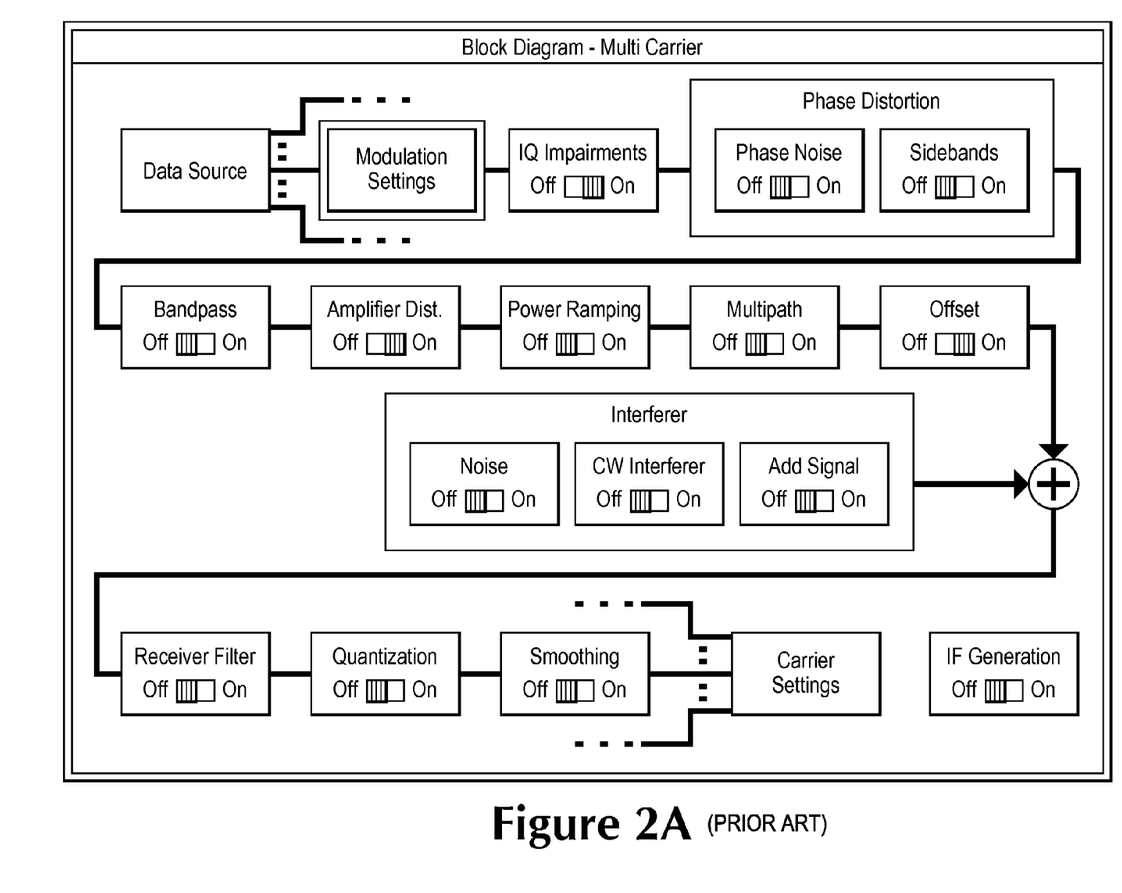
FIG. 2A is the Multi carrier block diagram with Modulation Setting block highlighted.
Figure 2B:
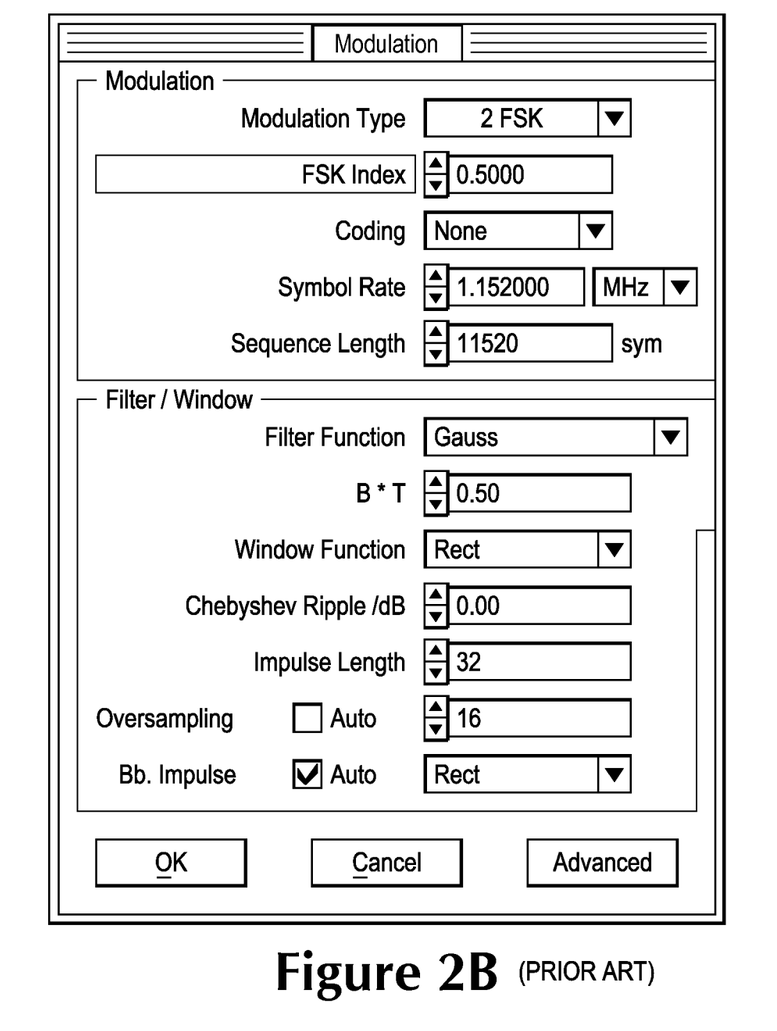
FIG. 2B is a Modulation Setting dialog window called using the Multi carrier block diagram.
Figure 3A:
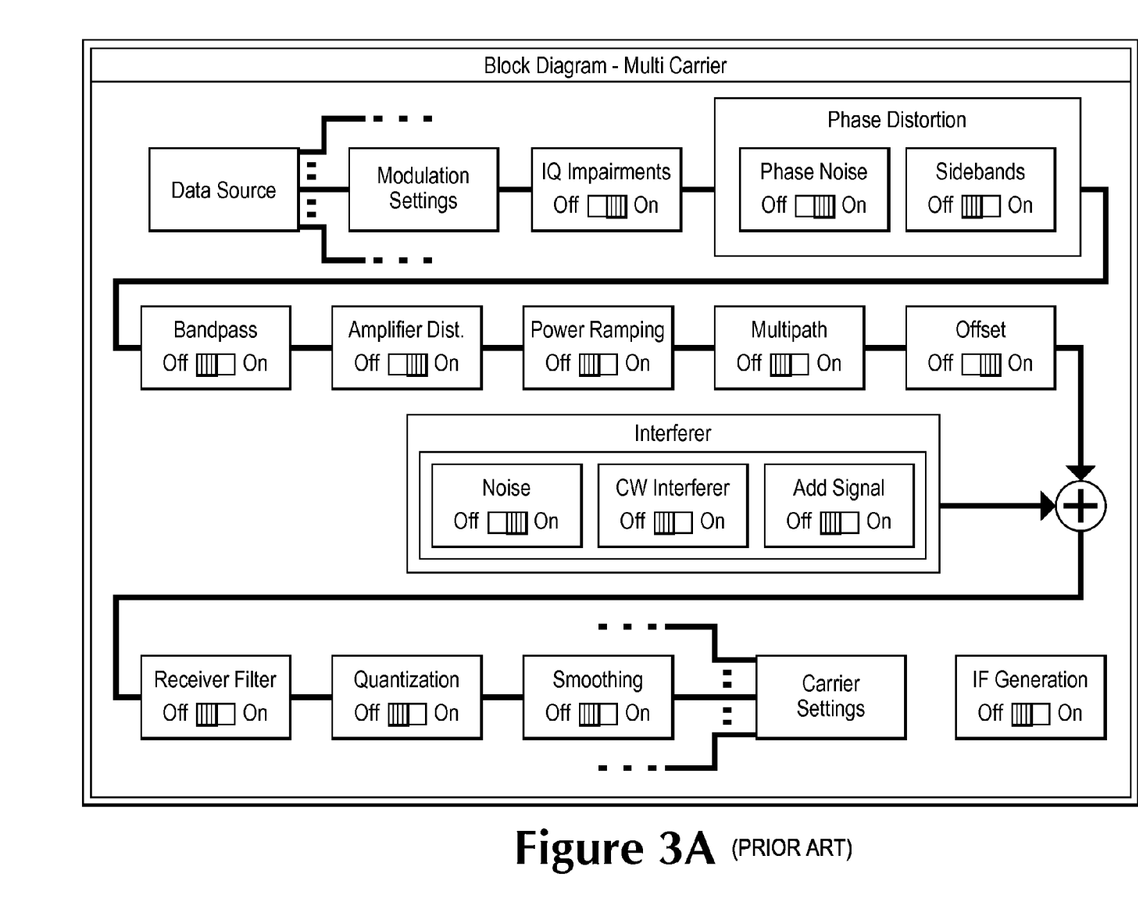
FIG. 3A is the Multi carrier block diagram with Noise block highlighted.
Figure 3B:
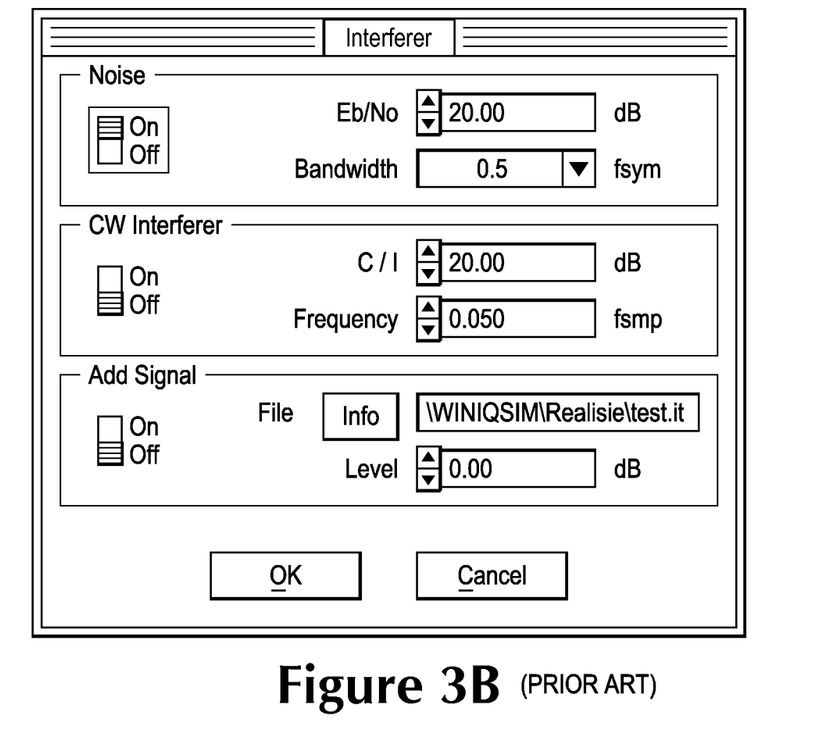
FIG. 3B is a Noise dialog window called using the Multi carrier block diagram.

Various manufacturers provide user interfaces for setting-up test signals. One Example is the WinIQSIM™ Simulation Software, manufactured and sold by Rohde & Schwarz. The simulation software provides a user interface for setting-up digitally modulated signals and adding impairments to the signals. The user interface has a multi-carrier block diagram as shown in FIG. 1A having various blocks for defining parameters and setting impairments to the signal. Clicking on one of the blocks, such as the Data Source block, opens a data source dialog window as shown in FIG. 1B where the user can define data parameters or import a data file. Once the user has set the parameters of the data source, the user clicks the OK box and the dialog box closes. Clicking on the Modulation Setting block as shown in FIG. 2A opens a Modulation dialog window as shown in FIG. 2B where the user can set the modulation parameters of the signal. Clicking on the OK box closes the Modulation Setting dialog window. Clicking on the Noise block as shown in FIG. 3A and setting the Noise "On" opens a Noise dialog window as shown in FIG. 3B where the user can set noise levels for the signal. Clicking on the OK box closes the Noise dialog window.

A drawback to the above described user interface is that the noise impairment is applied to the total signal and is not to selected portions of the signal, such as the Preamble, Physical Layer Convergence Protocol (PLCP) Header, Payload or selected symbols within a WiMedia ultra wideband signal as defined by the WiMedia Alliance. Keeping selected portions of the WiMedia ultra wideband signal free of noise, such as the Preamble, allows the user to better discriminate the contribution of the added noise in the received signal, allowing the user to setup appropriate demodulation and channel equalization schemes.

What is needed is a user interface for use with a signal generator that allows a user to add noise to selected portions of test signal, such as pseudo random noise, additive white Gaussian noise (AWGN) and the like. The user should be able to select the location of the noise within the signal and set the level of noise to be produced.

SUMMARY OF THE INVENTION

The present invention is a signal generator and method for adding amplitude noise to a test signal. The signal generator has a user interface for selecting a segment of the test signal and an associated power level for applying amplitude noise at a selected power level to the test signal segment. A signal processing unit compiles the selected power level of the selected segment with the test signal to generate digital data representative of the test signal with the selected segment having amplitude noise. A waveform generator receives the digital data and generates a test signal output having amplitude noise at selected segments of the test signal. A memory stores the compiled digital data representative of the test signal with amplitude noise at the selected segment.

The user interface has a packets display element and a symbols display element with the selection of the packets radio button display element activating selectable pre-defined packet segments of the test signal with each pre-defined packet segment having an associated selectable power level box. One of the pre-defined packet segments may be selected along with a selected power level of the amplitude noise in the selected segment. The selection of the symbols radio button display element activates symbol boxes and associated selectable power level box. Beginning and ending symbol numbers of a segment of the test signal may be selected along with a selected power level of the selected segment amplitude noise.

The method for adding amplitude noise to a test signal has the step of: selecting a segment of the test signal to add amplitude noise; selecting a power level for the amplitude noise; and applying the amplitude noise at the selected power level to the selected segment of the test signal. The selecting of the test signal segment may include the step of selecting at least one from a plurality of packets within the test signal to apply the amplitude noise. The packet selecting step includes the step of selecting from the plurality of packets one of a pre-defined preamble, a Physical Layer Convergence Protocol (PLCP) header, and a payload packet. The selecting of the test signal segment step may alternately have the step of selecting a sequence of symbols within the test signal to apply the amplitude noise. The applying step includes compiling the amplitude noise at the selected power level of the selected segments with the test signal. The compiling step includes the step of generating an additive white Gaussian noise (AWGN), pseudo-random noise, or the like for the amplitude noise.

The objects, advantages and other novel features of the present invention are apparent from the following detailed description when read in conjunction with the appended claims and attached drawings.

DESCRIPTION OF THE INVENTION

Figure 4:
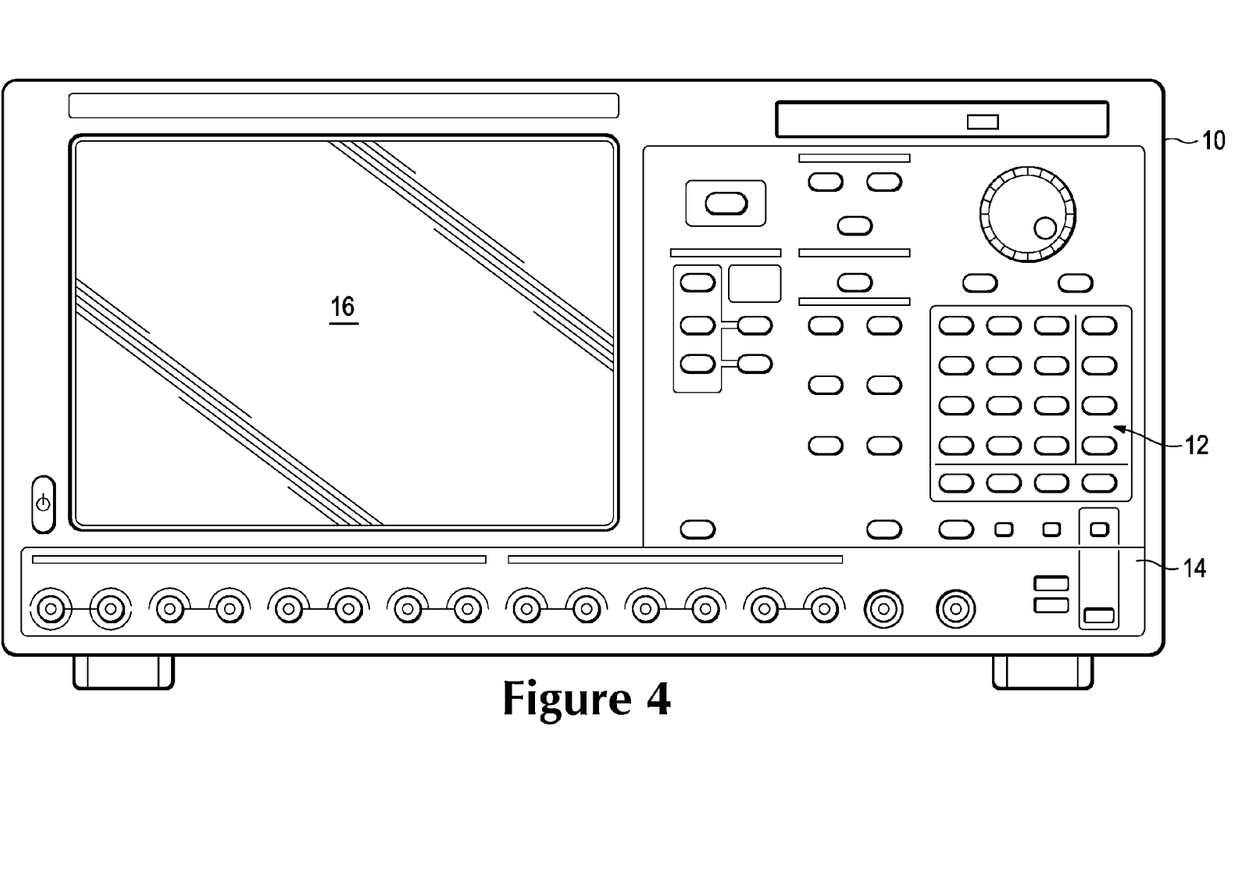
FIG. 4 shows a signal generator having a user interface for selecting amplitude noise segments in a test signal according to the present invention.

Referring to FIG. 4, there is shown a signal generator 10, such as the AWG7102, manufactured and sold by Tektronix, Inc. Beaverton, Oreg. The signal generator 10 generates signal outputs defined by a user using front panel controls, such as buttons and knobs 12 on the front panel 14 of the signal generator 10 in conjunction with a user interface displayed on a display device 16, such as a liquid crystal display, cathode ray tube or the like. The signal generator 10 also has a CD or DVD/CD drive for storing waveform data, executable programs and the like.

Figure 5:
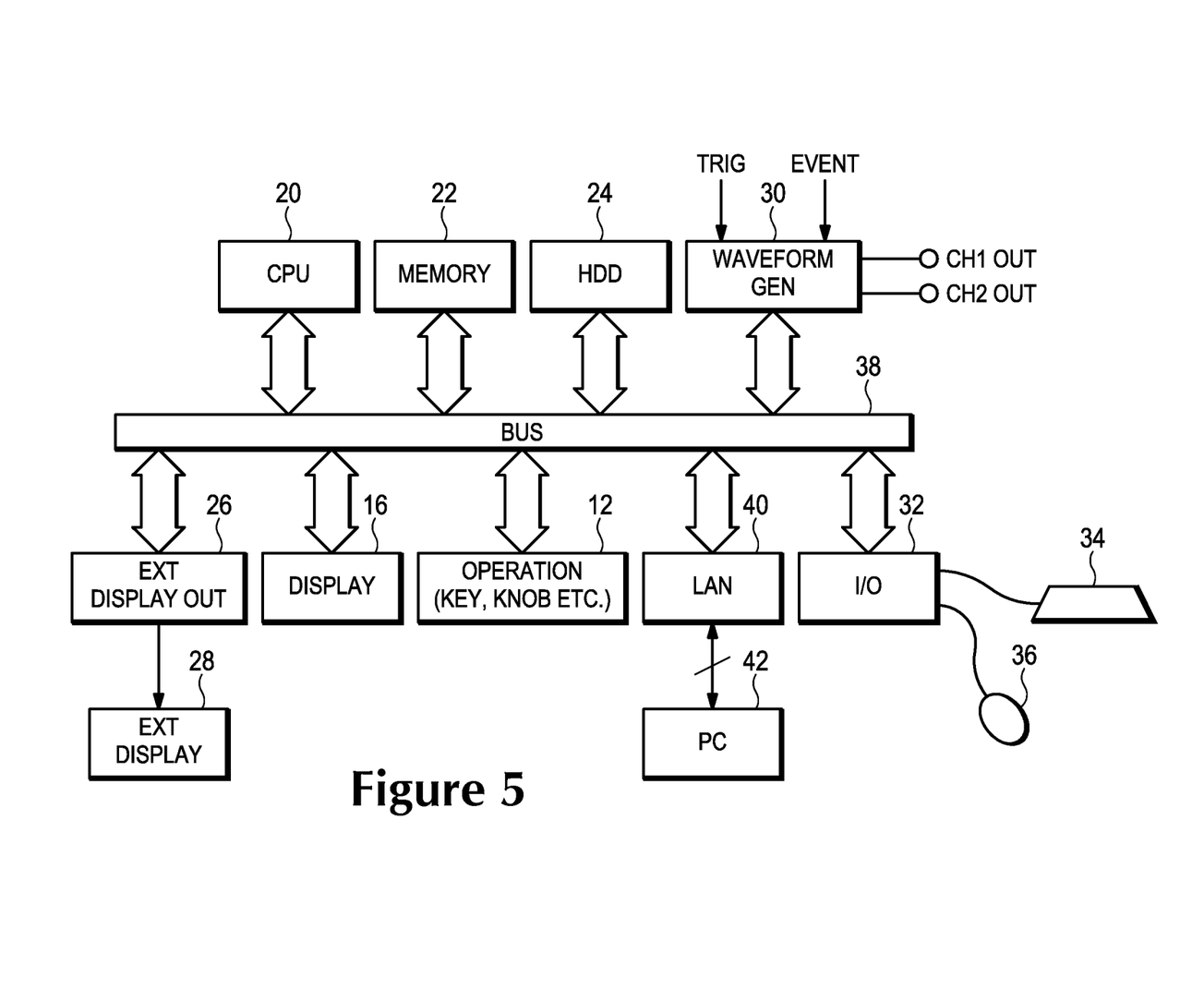
FIG. 5 is a representative block diagram of a signal generator having the user interface for selecting amplitude noise segments in a test signal according to the present invention.

With reference to FIG. 5, there is shown a representative block diagram of the AWG7102 signal generator 10. The signal generator 10 has a central processing unit (CPU) 20 that controls the operation of the instrument according to programs stored on a hard disk drive (HDD) 24. A memory 22, such as RAM memory, is used for a work area for the CPU 20 for programs read from the storage device 24. A user can set up the signal generator via the button, knobs and the like 12 on the front panel 14 of the instrument. The display device 16 provides the user interface for visualizing the information relating to signal patterns and user settings. An external display output circuit 26 provides a video output which may be connected to an external display 28 for providing a larger display area in addition to the built-in display 16 of the signal generator. A waveform generation circuit 30 generates signal patterns based on user defined parameters. In this example, the waveform generator circuit has two channel outputs and inputs for trigger and event signals. An input/output port 32 is used for connecting an external keyboard 34, a pointing device, such as a mouse 36, and the like to the signal generator. The external keyboard 34 and/or mouse 36 may be included as part of the front panel controls of the signal generator. The blocks are coupled together via a signal and data bus 38. The bus 38 of the signal generator may have a Local Area Network (LAN) interface 40 for connecting the signal generator to an external controller, such as a personal computer (PC) 42. The LAN interface 40 allows the user interface to operate on the PC 42 as well as enabling the PC 42 to control the signal generator over a network. Alternatively, a General Purpose Interface Bus (GPIB) interface may be used for the LAN interface 40.

Figure 6:
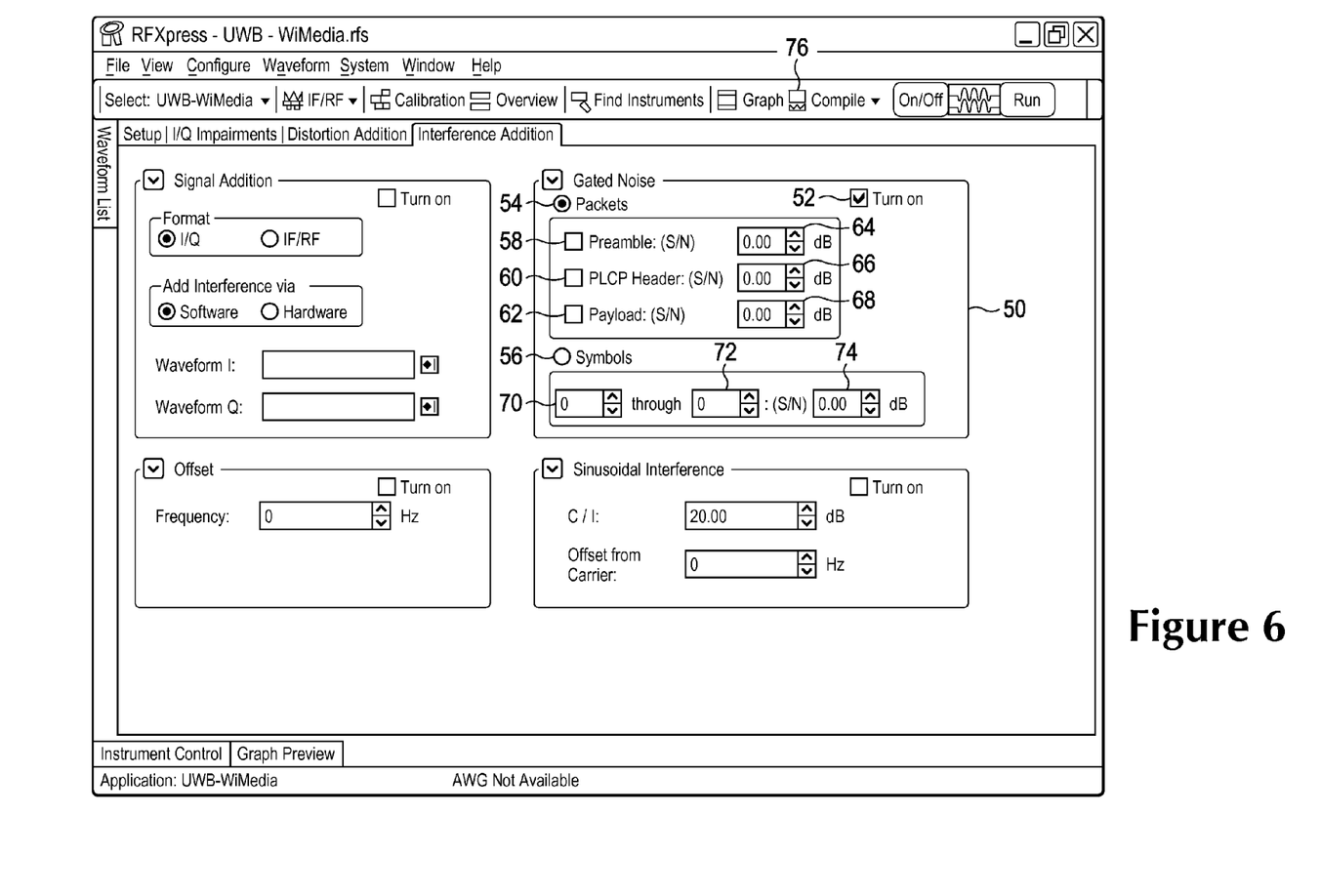
FIG. 6 is a display of the user interface for applying noise to selected portions of a test signal according to the present invention.
Figure 7:
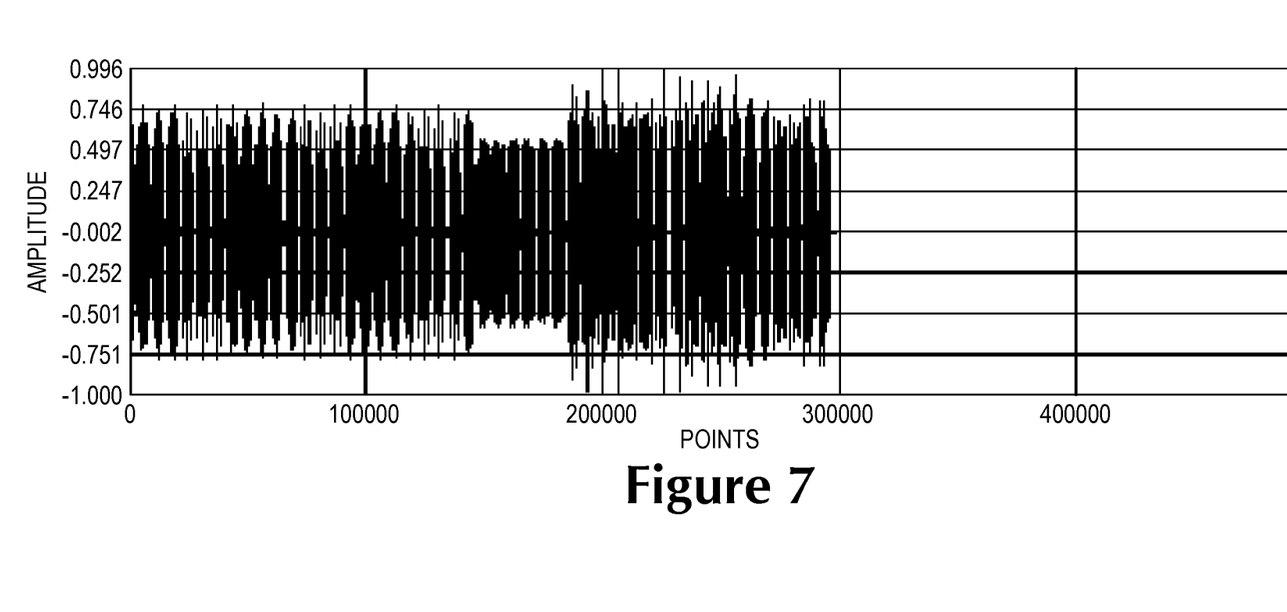
FIG. 7 is a display of test signal prior to the application of noise to selected portion of the test signal.
Figure 8:
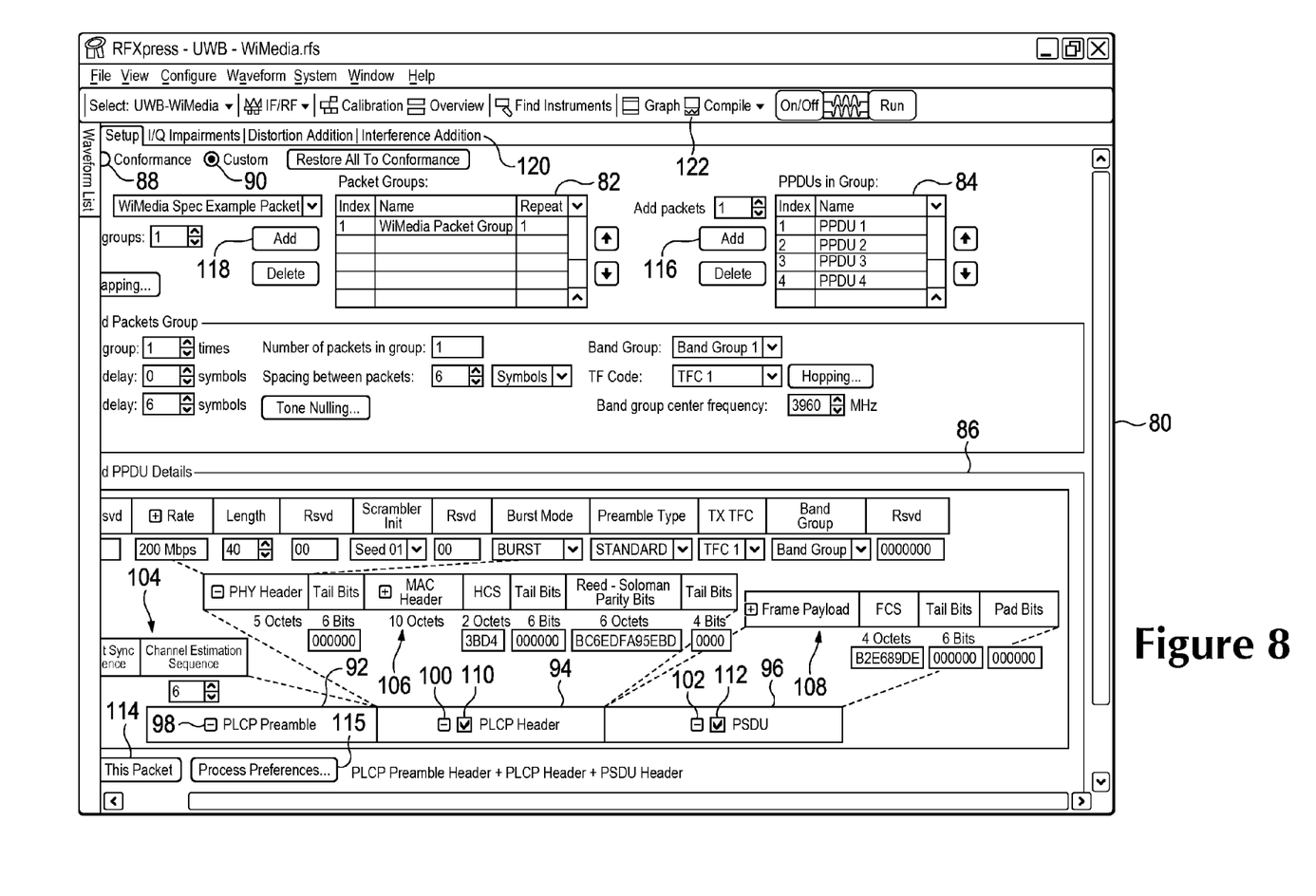
FIG. 8 is display of the signal definition user interface incorporating the user interface for applying noise to selected portions of a test signal according to the present invention.

Referring to FIG. 6, there is shown the gated noise user interface 50 for setting user specified power levels of amplitude noise on segments of a test signal, such as an WiMedia ultra wideband signal as defined by the WiMedia Alliance, such as displayed in FIG. 7. The WiMedia ultra wideband signal is shown without any amplitude noise added to the signal. The gated noise user interface 50 operates under program control of the CPU 20 with the user interface programs stored on the HDD 24. The gated noise user interface 50 may be displayed on the display device 16 or on the external display 28. Alternately, the gated noise user interface programs may be stored and accessed by the PC 42. The gated noise user interface 50 is preferably activated from within a signal definition user interface 80 as shown in FIG. 8 and described in greater detail below. Performing data entry operations is done using the front panel controls 12 of the signal generator 10 or by using the keyboard 34 and mouse 36 connected to the signal generator 10. The gated noise user interface 50 has a "Turn on" check box 52 that is clicked to activate the gated noise user interface 50. The user may add amplitude power noise, preferably in the form of an additive white Gaussian noise (AWGN), pseudo-random noise, or the like, to pre-defined segments of the WiMedia ultra wideband signal packets, such as Preamble, Physical Layer Convergence Protocol (PLCP) Header and Payload by clicking the on the "Packets" icon radio button display element 54. The user may also add amplitude noise to selected symbols within the packets by clicking on the "Symbols" radio button display element 56. Check boxes, radio buttons, icons, and the like are display elements of the gated noise user interface 50 and a signal definition user interface 80 to be described in greater detail below.

Figure 9:
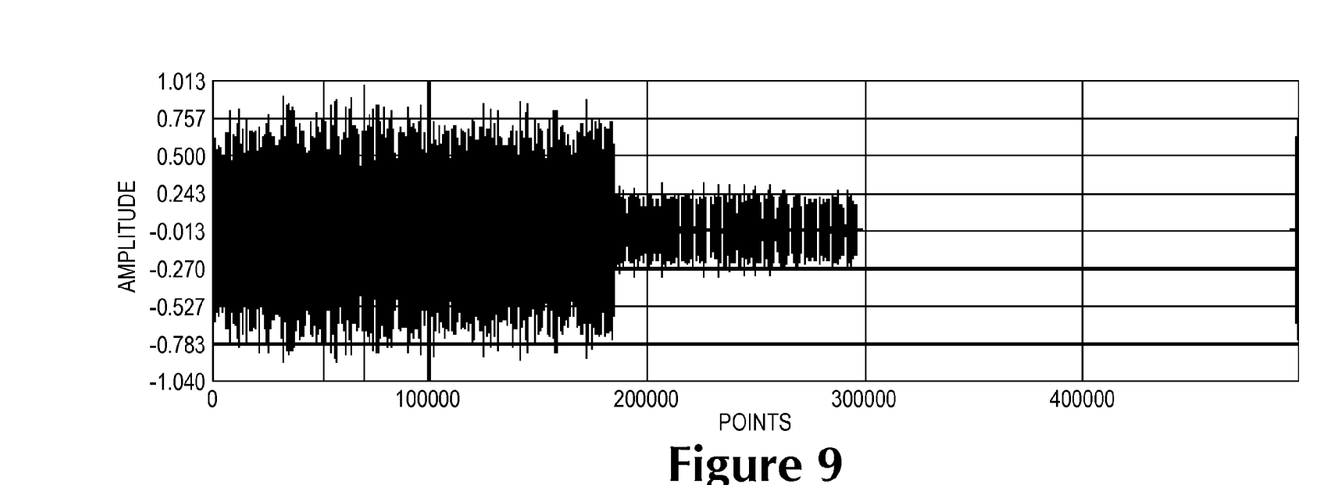
FIG. 9 is a display of a test signal with amplitude noise applied to the preamble of the test signal.

If the user selects "Packets", then the user has the option of selecting one or more of the segments of the WiMedia ultra wideband test signal by clicking on the appropriate check boxes 58, 60, 62 associated with each of the signal segments. Each signal segment also has a power level data box 64, 66, 68 in which the user can set the power level of amplitude noise on the selected segment of the test signal. For example, the user may wish to add −10 dB of noise to the Preamble. The user clicks on the check box 58 associated with the Preamble and then enters −10 dB into the power level data box 64 associated with the Preamble. Each of the power level data boxes 64, 66 and 68 have up/down arrows which the user can click on to increase or decrease the power level of the noise. The resulting output test signal, as shown in FIG. 9 has the prescribed amount of amplitude noise applied to the Preamble of each packet of the test signal.

Figure 10:
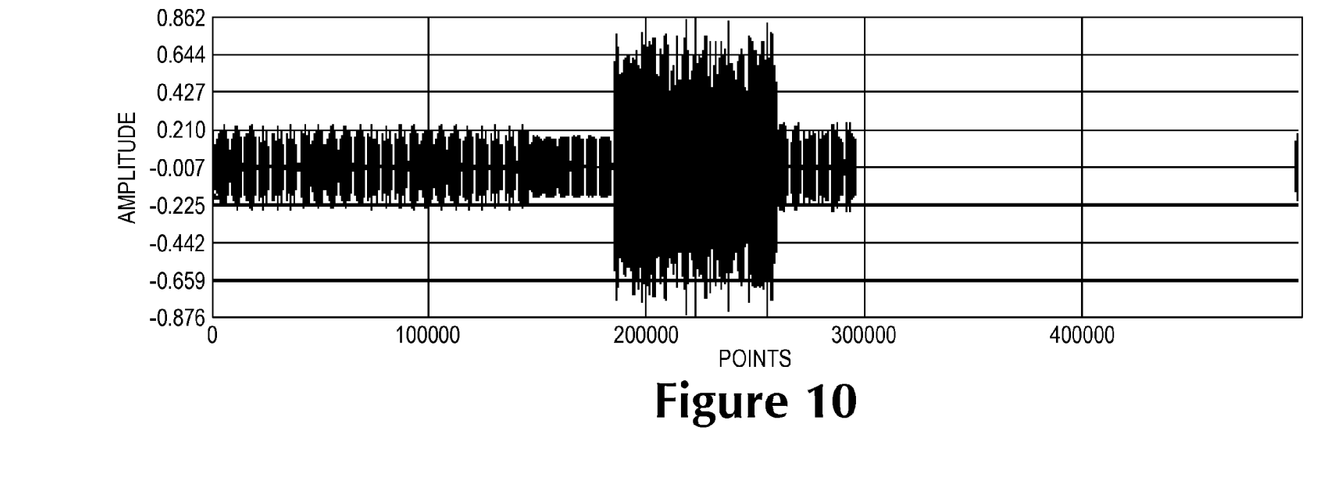
FIG. 10 is a display of the test signal with amplitude noise applied to the header of the test signal.

In another example, the user wishes to add −10 dB of amplitude power noise to the PLCP Header. The user clicks on the check box 60 associated with the PLCP Header and enters −10 dB in the power level data box 66 associated with the PLCP Header. The resulting output test signal, as shown in FIG. 10 has the prescribed amount of amplitude power noise applied to the PLCP Header of each packet of the test signal.

If the user selects "Symbols", the user has the option of setting which symbols in the WiMedia ultra wideband test signal will receive the amplitude power noise. The "Symbol" area has two symbol data boxes 70 and 72 in which the user can enter the beginning and ending symbol numbers. Each of the data boxes 70 and 72 have up/down arrows which the user can click on to increase or decrease the symbol numbers. There is also included a power level data box 74 in which the user can set the level of amplitude power noise on the selected symbols. As with the other power level data boxes, the power level data box 74 has up/down arrows which the user can click on to increase or decrease the amplitude power level of the noise. When the user has set the gated noise for the test signal, the user may click on the compile button 76 to corn pile the test signal with the selected gated noise on the test signal.

The gated noise user interface 50 is preferably incorporated into a signal definition user interface 80, as shown in FIG. 8, where a user sets parameters and data values for the WiMedia ultra wideband signal. The user interface 80 includes a Packet Group area 82 for defining Packet Groups and PPDUs in Group area 84 for defining Presentation Protocol Data Units (PPDUs). Associated with each PPDU is a frame structure interface 86 of the UWB signal. The frame structure 86 allows the user to define Presentation Protocol Data Units (PPDUs) settings 84 using front panel controls 12 of the signal generator 10 or by using a keyboard 34 and mouse 36 connected to the signal generator 10. The user interface 80 has two mode radio buttons 88 and 90 for setting the operational modes of the WiMedia ultra wideband signal. One mode is for conformance testing and the other allows the customizing of the parameters of the WiMedia ultra wideband signal. In conformance testing, the parameters of the UWB signal are fixed as defined by the standard apart from the pull down options that are provided, such as length, scrambler init, burst mode, preamble type and the like. In the custom mode, the parameters are editable and can be modified by the user.

The frame structure 86 displays PPDU elements as a PLOP Preamble box 92, a PLCP Header box 94 and a PSDU (Physical Layer Service Data Unit) box 96 which are defined in the WiMedia ultra wideband signal standard. Each of the boxes 92, 94, and 96 has a smaller "±" box 98, 100, 102 that may be clicked on to display components of each of the PLCP Preamble, PLCP Header and the PSDU as shown by component boxes 104, 106 and 108. The PLCP Header box and the PSDU box each has a further check box 110, 112 that may be clicked on and off. The PLCP Header and/or the PSDU are not provided in the WiMedia ultra wideband signal when their respective check boxes 110, 112 are clicked off. Selected component boxes of the PLCP Preamble, PLCP Header and the PSDU also have "±" boxes which allows the user to display detailed setting items associated with the components.

The user builds a test signal by first selecting between the conformance mode and the custom mode. In either mode, the user defines PPDUs by assigning a PPDU name in a Name column in a display box of the PPDUs in Group area 84. The Name column has an associated Index column which provides indexes values to the PPDU names. The user then uses the frame structure 86 for setting the parameters for the named PPDU. In the conformance mode, the user is restricted to changing parameters that are provided in the drop down menus associated with curtain of the components and allowed by the WiMedia ultra wideband signal standard. In the custom mode, the parameters may be changed beyond the boundaries of the WiMedia ultra wideband signal standard and/or intentional error data (data impairment) may be provided to the test signal. This allows a test signal to be generated that stresses a device under test receiving the signal to determine the operating limits of the device under test and characterize the design of the device under test to secure the operational stability.

Assuming the user interface is set for the custom mode, the user can individually click on the "±" boxes 98, 100, 102 in the PLCP Preamble box 92, the PLCP Header box 94 and a PSDU box 96 to display the respective components boxes 104, 106 and 108 of the Preamble, Header and PSDU. When a "−" symbol appears in one of the "±" boxes 98, 100, 102, the associated component boxes 104, 106 and 108 of the Preamble, Header and the PSDU are displayed. When a "+" symbol appears in one of the "±" boxes 98, 100, 102, the associated component box 104, 106, 108 is not displayed.

Associated with each of the components are either drop down menus or data boxes which the user may select or enter values. Some of the component boxes 104, 106 and 108 also have "±" boxes, such as the Packet Sync Sequence in the Preamble component boxes 104, the PHY Header and MAC Header in the PLCP Header component boxes 106 and the Frame Payload in the PSDU component boxes 108. Clicking on the "±" boxes in the component boxes displays detailed setting items of the components, such as the shown by the "−" in the "±" box associated with the PHY Header component. The PHY header detailed setting items further have drop down menus and data boxes which the user may select or input values. A "Process This Packet" icon 114 is provided at the bottom of the signal definition user interface 80 for processing the entered data and parameters for each of the PLCP Preamble, PLCP Header and PSDU in the PPDU into hexadecimal codes. At this time, checking codes such as HCS, etc. are automatically generated. If the user wants to maintain the intentional modification via the user interface rather than the auto-generation, "Process Preferences" 115 provides an option to select whether the auto-generation is applied or not.

Once the user has set the parameters for the currently defined PPDU, the user can add a new PPDU to the PPDUs in Group area 84 by clicking the add button 116 associated with the PPDUs in Group area 84 are and assign a new PPDU name. The user then uses the frame structure 86 to set the parameters for the new PPDU. The user can define and set the parameters for any number of PPDUs by assigning new PPDU names for each of the PPDU as representatively shown by PPDU 1 through PPDU 4 in PPDUs in Group area 84.

The PPDUs are grouped into Packet Groups using the Packet Group area 82. The Packet Group area 82 has a display box that includes an Index column, a Name column, and a Repeat column. The user assigns a name to the Packet Group and set the number of times the Packet Group is to repeat. An index value is assigned to each Packet Group. An add button 118 associated with the Packet Group 82 allows a user to add new Packet Groups. The ability to associate multiple PPDUs with a Packet Group, define multiple Packet Groups and repeat the Packet Groups multiple times allows the user to develop a complex test signal for stressing a device under test.

Once the user has defined the test signal, the user can click on the "Interference Addition" tab 120 in the signal definition user interface 80 to add gated noise to the test signal. Clicking on the "Interference Addition" tab 120 opens the interference addition window as shown in FIG. 6 containing the Gated Noise user interface 50. The user adds amplitude power noise to some or all of the signal packets of the defined test signal and then clicks on the compile icon 122 at the top of the signal definition user interface 80. The signal definition user interface program compiles the parameters and data for the test signal including the gated noise into digital data values that are stored in the memory 22 of the signal generator 10. The waveform generation circuit 30 in the signal generator 10 receives the stored digital data representing the test signal and generates signal patterns based on user defined parameters and values set using the signal definition user interface 80 and the gated noise user interface 50.

While the above gated noise user interface 50 has been described in relation to a WiMedia ultra wideband signal, the present invention may also be incorporated for use with other signal standards, such as 802.11n, 802.15.3c, WiFi, WIMAX, and WIHD standards.

The foregoing description of the invention has been described for the purposes of clarity and understanding. It is not intended to limit the invention to the precise form disclosed.

What is claimed is:

1. A method of adding amplitude noise to a test signal comprising the steps of:
   a) selecting a segment of the test signal to add amplitude noise, wherein the segment is less than the entirety of the test signal and is selected from at least one from a plurality of packets within the test signal;
   b) selecting a power level for the amplitude noise; and
   c) applying the amplitude noise at the selected power level to the selected segment of the test signal with steps a), b) and c) being implemented using a signal generator having a user interface;
   the user interface displaying elements for the segments of the test signal and the power level for actuation by a user.

2. The method of adding amplitude noise to a test signal as recited in claim 1 wherein the selecting the segment of the test signal to add amplitude noise step further comprises the step of selecting from the plurality of packets one of a pre-defined preamble, a Physical Layer Convergence Protocol (PLCP) header, and a payload packet.

3. The method of adding amplitude noise to a test signal as recited in claim 1 wherein the selecting of the test signal segment step further comprises the step of selecting a sequence of symbols within the test signal to apply the amplitude noise.

4. The method of adding amplitude noise to a test signal as recited in claim 1 wherein the applying step further comprises compiling the amplitude noise at the selected power level of the selected segments with the test signal.

5. The method of adding amplitude noise to a test signal as recited in claim 4,
   wherein the compiling step further comprises the step of generating a pseudo-random noise pattern for the amplitude noise.

6. The method of adding amplitude noise to a test signal as recited in claim 4,
   wherein the compiling step further comprises the step of generating an additive white Gaussian noise pattern for the amplitude noise.

7. A signal generator for generating amplitude noise on a test signal comprising:
   a user interface for selecting a segment of the test signal and an associated power level for applying amplitude noise at a selected power level to the selected test signal segment, wherein the segment is less than the entirety of the test signal;
   a signal processing unit compiling the selected power level of the selected segment with the test signal to generate digital data representative of the test signal with selected segments having amplitude noise; and
   a waveform generator receiving the digital data and generating a test signal output having amplitude noise at the selected segments of the test signal.

8. The signal generator as recited in claim 7 further comprising a memory storing the compiled digital data representative of the test signal with amplitude noise at selected segments.

9. The signal generator as recited in claim 7 wherein the user interface further comprises selectable packets and symbols display elements.

10. The signal generator as recited in claim 9 wherein the selectable packet display element activates selectable pre-defined packets segments of the test signal for selecting the pre-defined packet segment and each pre-defined packet segment having a selectable power level box for selecting the power level of the selected segment amplitude noise.

11. The signal generator as recited in claim 9 wherein the selectable symbols display element activates symbol boxes for selecting beginning and ending symbol numbers of the segment of the test signal and a selectable power level box for selecting the power level of the selected segment amplitude noise.

12. The signal generator as recited in claim 7 in which the waveform generator includes means for generating an additive white Gaussian or pseudo-random noise pattern for the amplitude noise applied to the selected test signal segment.

* * * * *